(12) United States Patent
Plößl et al.

(10) Patent No.: US 10,991,845 B2
(45) Date of Patent: Apr. 27, 2021

(54) METHOD FOR PRODUCING AN OPTOELECTRONIC SEMICONDUCTOR COMPONENT AND OPTOELECTRONIC SEMICONDUCTOR COMPONENT

(71) Applicant: OSRAM Opto Semiconductors GmbH, Regensburg (DE)

(72) Inventors: Andreas Plößl, Regensburg (DE); Siegfried Herrmann, Neukirchen (DE); Martin Rudolf Behringer, Regensburg (DE); Frank Singer, Regenstauf (DE); Thomas Schwarz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/940,929

(22) Filed: Mar. 29, 2018

(65) Prior Publication Data
US 2018/0287008 A1    Oct. 4, 2018

(30) Foreign Application Priority Data
Mar. 29, 2017  (DE) .......................... 102017106755.8

(51) Int. Cl.
*H01L 33/00*    (2010.01)
*H01L 33/48*    (2010.01)
*H01L 25/075*   (2006.01)

(52) U.S. Cl.
CPC ........ *H01L 33/005* (2013.01); *H01L 25/0753* (2013.01); *H01L 33/0095* (2013.01); *H01L 33/483* (2013.01)

(58) Field of Classification Search
CPC ............. H01L 25/0753; H01L 33/0079; H01L 33/005; H01L 33/0093; H01L 33/52
See application file for complete search history.

(56) References Cited

U.S. PATENT DOCUMENTS

| 8,173,908 B2 * | 5/2012 | Altebaeumer ...... H01L 23/5387 174/261 |
| 8,524,573 B2 * | 9/2013 | Kaiser ................... H01L 21/268 219/121.85 |

(Continued)

FOREIGN PATENT DOCUMENTS

| DE | 102016221281 A1 | 5/2018 |
| DE | 102017100812 A1 | 8/2018 |

(Continued)

OTHER PUBLICATIONS

Fukushima, T., et al., "Multichip Self-Assembly Technology for Advanced Die-to-Wafer 3-D Integration to Precisely Align Known Good Dies in Batch Processing," IEEE Transactions on Components, Packaging and Manufacturing Technology, vol. 1, No. 12, Dec. 2011, pp. 1873-1884.

(Continued)

*Primary Examiner* — Shih Tsun A Chou
(74) *Attorney, Agent, or Firm* — Slater Matsil, LLP (57) ABSTRACT

A method for producing an optoelectronic semiconductor component and an optoelectronic semiconductor component are disclosed. In an embodiment the method include A) providing at least two source substrates, wherein each of the source substrates is equipped with a specific type of radiation-emitting semiconductor chip; B) providing a target substrate having a mounting plane, the mounting plane being configured for mounting the semiconductor chip; and C) transferring at least part of the semiconductor chips with a wafer-to-wafer process from the source substrates onto the target substrate so that the semiconductor chips, within one type, maintain their relative position with respect to one another, so that each type of semiconductor chips arranged on the target substrate has a different height above the mounting plane, wherein the semiconductor chips are at (Continued)

least one of at least partially stacked one above the other or at least partially applied to at least one casting layer.

18 Claims, 10 Drawing Sheets

(56) References Cited

U.S. PATENT DOCUMENTS

| | | | |
|---|---|---|---|
| 10,177,123 B2* | 1/2019 | Gardner | H01L 25/0753 |
| 2012/0248477 A1* | 10/2012 | Tischler | H01L 27/156 257/89 |
| 2013/0126827 A1 | 5/2013 | Bibl et al. | |
| 2014/0374783 A1* | 12/2014 | Ahn | H01L 25/167 257/93 |
| 2015/0076534 A1 | 3/2015 | Terakami et al. | |
| 2015/0111329 A1 | 4/2015 | Wu et al. | |
| 2017/0301660 A1* | 10/2017 | Pokhriyal | H01L 21/6835 |
| 2018/0247922 A1* | 8/2018 | Robin | H01L 25/167 |
| 2018/0366450 A1* | 12/2018 | Gardner | H01L 25/0753 |

FOREIGN PATENT DOCUMENTS

| | | | |
|---|---|---|---|
| JP | 7283438 A | | 10/1995 |
| WO | WO2017/124332 | * | 7/2017 |

OTHER PUBLICATIONS

Meitl, M., et al., "Transfer printing by kinetic control of adhesion to an elastomeric stamp," Nature Materials, vol. 5, Dec. 11, 2005, pp. 33-38.

* cited by examiner

METHOD FOR PRODUCING AN OPTOELECTRONIC SEMICONDUCTOR COMPONENT AND OPTOELECTRONIC SEMICONDUCTOR COMPONENT

CROSS-REFERENCE TO RELATED APPLICATIONS

This application claims the benefit of German patent application 10 2017 106 755.8, filed on Mar. 29, 2017, which application is hereby incorporated herein by reference.

TECHNICAL FIELD

The invention relates to a method for producing an optoelectronic semiconductor component. The invention further relates to an optoelectronic semiconductor component.

SUMMARY

Embodiments of the invention provide a method by which a target substrate can be fitted efficiently with a plurality of different types of semiconductor chips.

According to at least one embodiment, one or a plurality of optoelectronic semiconductor components are produced using the method. For example, the semiconductor components are display devices such as displays, in particular so-called RGB displays, or pixels or units of pixels for such displays. For example, each individual pixel has a semiconductor chip for red, green and blue light so that in particular RGB pixels are formed.

In embodiments, a plurality of semiconductor chips of a specific type can be present within a pixel, for example, two green-emitting semiconductor chips, in particular for RGGB pixels, or three blue-emitting semiconductor chips, for example, for RBBB pixels, also in combination with one or different phosphors. Furthermore, RGBB pixels can be formed with two semiconductor chips for blue light or else RRGB pixels, in order to counteract the relatively strong temperature dependence of an efficiency when generating red light. In addition, it is possible for only equal semiconductor chips to be combined to form a single-color emitting tile, said tiles are combined in the pixels in each case with tiles emitting different colors, wherein the tiles can extend to a plurality of different pixels. This means that one pixel can be composed of a plurality of the tiles.

The semiconductor components can also be pixelated lamps, for example, for modulation capable flash lights in which each or some of the pixels emit radiation of the same color, for example, warm white, or it is also possible that pixels for different colors are present, in particular with different white tones such as warm white and cold white.

According to at least one embodiment, the method comprises the step of providing at least two source substrates. Preferably, exactly three or exactly four source substrates are provided. Each of the source substrates is equipped with a specific type of radiation-emitting semiconductor chips, in particular, with light-emitting diode chips. For example, a first source substrate has structurally identical light-emitting diode chips designed to emit blue light, a second source substrate has structurally identical light-emitting diode chips for generating red light, and a third source substrate has structurally identical light-emitting diode chips for generating green light. Optionally, a fourth source substrate has structurally identical light-emitting diode chips for emitting near-infrared radiation. In particular, the source substrates for the green and/or blue-emitting semiconductor chips can be growth substrates. It is possible for the source substrates to be whole semiconductor wafers or discs, or that the source substrates are also only disk segments or wafer segments, for example, 3 cm×2 cm, which are transferred to the target substrate.

According to at least one embodiment, a target substrate is provided. The target substrate has a mounting plane. The mounting plane is preferably planar and, as intended, is not or not significantly curved. In this case, a possible, production-related curvature of the target substrate, for instance by means of temporarily elevated temperatures and thermal stresses, preferably remains unconsidered. The mounting plane is designed for mounting the semiconductor chips.

According to at least one embodiment, at least some of the semiconductor chips are transferred from the source substrates to the target substrate. The transfer is a disc-to-disc process, also referred to as a wafer-to-wafer process. This means, in particular, that a multiplicity of semiconductor chips are transferred in the wafer composite. As a result, it is possible for the semiconductor chips within one type transferred to the target substrate to retain their relative position with respect to one another. In other words, the transferred semiconductor chips within one type are arranged relative to one another on the target substrate in exactly the same way as on the associated source substrate. During the transfer from the source substrate to the target substrate, no spatial reorientation or re-sorting takes place with regard to the transferred semiconductor chips.

In various embodiments, this applies, in particular, to each transfer step. If, for example, for RGGB pixels, n semiconductor chips of the same emission color are required per finished pixel, n being a natural number, in particular n=2 or n=3, it is possible that all of these semiconductor chips are transferred from a single source substrate in a single transfer step. It is equally possible for n source substrates to be used, for example, for one row of these semiconductor chips each, so that n transfer steps take place, or that a source substrate is used from which the n transfer steps are carried out. Within each of the transfer steps, there is then no change in the positions of the transferred semiconductor chips relative to one another. If, for example, a plurality of transfer steps are carried out in particular from a single source substrate, the relative positions of the semiconductor chips transferred in different transfer steps are changed. This means that, relative to the source substrate, all semiconductor chips transferred in a first transfer step remain positioned in the same manner relative to one another; all the semiconductor chips transferred in a second transfer step also maintain their relative positions to each other; however, the positions of the semiconductor chips transferred in the first step change relative to the semiconductor chips transferred in the second transfer step.

According to at least one embodiment, each type of semiconductor chips on the target substrate has a different height above the mounting plane. All semiconductor chips of a specific type are thus arranged at the same level above the mounting plane on the target substrate. Thus, particularly preferably no two types of semiconductor chips are located at the same height. In other words, the heights for the types of semiconductor chips are each preferably different from one another in pairs. This applies in particular if the finished pixels each comprise exactly one semiconductor chip per type.

If, on the other hand, a plurality of semiconductor chips of the same emission color are required per pixel and these semiconductor chips are transferred in a plurality of transfer steps, thus, preferably exactly one height is present per transfer step. This means that the number of different heights is preferably equal to the number of transfer steps carried out. In the case of a plurality of identically emitting semiconductor chips per finished pixel, a plurality of different heights can thus be present per type of semiconductor chips; however, different types of semiconductor chips are particularly preferably always at different heights.

According to at least one embodiment, the semiconductor chips are applied in a stacked manner at least partially on top of one another. This means, for example, that the first semiconductor chips serve as a base or pedestal for the second semiconductor chips. The second semiconductor chips can likewise serve as a base or pedestal for the third semiconductor chips, and so on. In this case, the semiconductor chips can terminate flush with one another on at least one side when viewed in a plan view. The semiconductor chips mounted later can partially or completely cover the previously mounted semiconductor chips. It is possible for the semiconductor chips mounted later to be located completely or only in part within the previously mounted semiconductor chips, seen in a plan view.

According to at least one embodiment, at least one casting layer is produced. The one or more casting layer/s form/s a base or a pedestal for the subsequently applied type of semiconductor chips. If at least one casting layer is present, the semiconductor chips preferably do not overlap in a plan view.

In at least one embodiment, the method is configured for producing optoelectronic semiconductor chips and comprises the following steps, preferably in the order specified: A) providing at least two source substrates, wherein each of the source substrates is equipped with a specific type of radiation-emitting semiconductor chips, B) providing one or more target substrates each having a mounting plane, wherein the mounting plane is configured to be provided with the semiconductor chips, C) transferring at least part of the semiconductor chips to the target substrate by means of a wafer-to-wafer process from the source substrates, so that the semiconductor chips transferred to the target substrate retain their relative position with respect to one another within one type and in particular per transfer step so that each type of semiconductor chips on the target substrate has a different height above the mounting plane, wherein the semiconductor chips are at least partially stacked one above the other and/or are at least partially applied to at least one casting layer.

In various further embodiments, a parallel loading of an RGB module is thus performed using the chip geometry of the transferred units. This arrangement of the semiconductor chips enables sequential transfer of the semiconductor chips in two variants: The semiconductor chips themselves form transfer platforms for the following transfer steps, or a resulting level difference due to the application of the semiconductor chips is filled with a casting layer after each transfer step, so that the following electrical contacts and semiconductor chips are then applied to the resulting planarized plane. The display device is thus constructed sequentially in terms of height.

The transferred light-active layers, that is to say the individual semiconductor chips, are controlled, for example, using a cross-matrix circuit or are installed as individual RGB units. Thus, the miniaturized RGB units are scalable. Sizes of the individual semiconductor chips are preferably at least 1 μm×1 μm or 5 μm×5 μm and/or at most 200 μm×200 μm or 100 μm×100 μm.

According to further embodiments, a precise thin film transfer, that is a transfer of semiconductor chips without growth substrate, can be realized. Depending on the wafer size used, $10^4$ to $10^7$ semiconductor chips can be transferred per process step. In this case, a low component height can be achieved since only the light-active, epitaxially grown semiconductor layer of the semiconductor chips is transferred to the target substrate without growth substrates.

Different electrical connection concepts can be realized in a simple manner by means of the specified method. Conventional systems can be used for electrically contacting the semiconductor chips. There is only a minimal thickness variation on the target substrate across the semiconductor chips. Particularly small tolerances, for example, smaller than 1 μm, can be realized in the mounting plane. An extremely precise bonding method can be applied on the wafer level.

According to at least one embodiment, after each transfer step of one type of semiconductor chips, one of the casting layers is produced. The casting layer associated with the corresponding type is preferably produced before the next type of semiconductor chips is transferred or before the next transfer step is carried out. The corresponding type of semiconductor chips and the associated casting layer are preferably located in the same plane, wherein this plane can be oriented parallel to the mounting plane.

According to at least one embodiment, the casting layers have the same thicknesses as the semiconductor chips of the associated type of semiconductor chips. This preferably applies with a tolerance of at most 5 μm or 2 μm. Alternatively or additionally, this applies with a tolerance of at most 25% or 10% or 5% of a mean height of the associated type of semiconductor chips. According to at least one embodiment, electrical lines are provided for electrically connecting the semiconductor chips to both main sides of the casting layer associated with this type of semiconductor chips. For example, the electrical lines are produced plane by plane. A first plane of electrical lines can be applied before the first casting layer is produced. A further plane of the electrical lines is preferably produced after the casting layer associated with the respective type of semiconductor chips has been produced. This means that the following three method steps can be carried out in the specified sequence, in particular, following one another several times: applying the semiconductor chips of a specific type, creating the associated casting layer, and applying the associated electrical lines.

According to at least one embodiment, at least one of the casting layers, or all casting layers, or all of the casting layers except for the casting layer closest to the mounting plane, are light-transmissive. The casting layer closest to the mounting plane can be reflective and, for example, can appear white. It is thus possible for the light generated during operation to be radiated at least partially through the translucent casting layers.

According to at least one embodiment, the types of semiconductor chips which are not located closest to the mounting plane are applied on the casting layer associated with the previously applied type of semiconductor chips. This means that the respective semiconductor chips are then located completely or partially on the previously applied casting layer. Thus, a mounting platform for the respective transfer step can be formed via the casting layer.

According to at least one embodiment, the semiconductor chips do not overlap one another when viewed in a plan view. This means that the semiconductor chips are mounted beside one another. Viewed in a plan view, the semiconductor chips can be spaced apart from one another or touch each other. This applies in particular to the pixels in the finished optoelectronic semiconductor components and/or to the case when at least one casting layer is provided on which part of the semiconductor chips is applied.

According to at least one embodiment, the semiconductor chips overlap one another partially or completely when viewed in a plan view. This means that the previously applied type of semiconductor chips can serve as a mounting platform for the subsequently applied type of semiconductor chips. In this case, the at least one casting layer can be omitted.

According to at least one embodiment, light generated during operation of the finished optoelectronic semiconductor components, said light being generated in semiconductor chips located in closer proximity to the mounting plane, partially or completely travels through the semiconductor chips located further away from the mounting plane. In this case, the types of semiconductor chips applied in the different transfer steps are preferably arranged stacked one above the other and at least partially overlapping one another.

According to at least one embodiment, at least $10^4$ or $10^5$ or $10^6$ of the semiconductor chips are transferred per type in step C). The number of semiconductor chips transferred per type is alternatively or additionally at most $10^8$ or $10^7$.

According to at least one embodiment, precisely three types of semiconductor chips are transferred. In this case, one type of semiconductor chips is used for emitting green light, one type for the emission of red light and one type for the emission of blue light. Within a specific type, the semiconductor chips are identical in construction, within the scope of the production tolerances. As a result, RGB pixels can be generated in large numbers for a display device or for subsequent separation.

Alternatively, it is possible that not only visible light-emitting semiconductor chips, but also further semiconductor chips, for example, for generating near-infrared radiation, are installed.

According to at least one embodiment, in particular in the finished RGB pixels, in plan view the semiconductor chips terminate flush with one another at precisely one or at a plurality of or at all side edges. This applies, for example, with a tolerance of at most 5 µm or 2 µm.

According to at least one embodiment, the different types of semiconductor chips are each arranged in rows. In this case, preferably a plurality of rows of semiconductor chips of a specific type is present. It is possible for only semiconductor chips of the same type to be mounted within one row. Alternatively, the rows are composed of semiconductor chips of a plurality of different types.

According to at least one embodiment, the rows with the types of semiconductor chips are arranged periodically. A periodicity is preferably n, that is to say the number of types of semiconductor chips. If, for example, three types of semiconductor chips are present, three different types of rows are preferably present. If a translation takes place by three rows in the direction perpendicular to the rows, the rows are preferably imaged in corresponding subsequent rows.

According to at least one embodiment, a staircase is formed, as viewed in cross section, in each case by n consecutive rows. The staircase preferably has n or n−1 steps, in particular in relation to the mounting plane. The steps are realized, for example, by the platforms and optionally by electrical contact areas for the semiconductor chips.

According to at least one embodiment, all staircases are identically oriented on the target substrate. This means that the staircases preferably run parallel to one another and rise along the same direction.

According to at least one embodiment, a distance between adjacent semiconductor chips within a staircase and/or within a pixel is smaller than a distance between adjacent staircases and/or between adjacent pixels. This applies in a plan view of the mounting plane. Alternatively, the semiconductor chips can extend across several or across all of the staircases and/or of the pixels at an invariant distance and in a regular grid.

According to at least one embodiment, in step C) only part of the semiconductor chips originally present on the respective source substrate is transferred to the target substrate. The number of originally present semiconductor chips relates in particular to the fully populated source substrate, before a first transfer step of the semiconductor chips to the target substrate, for instance directly after the semiconductor chips have been produced and/or patterned. Based on the originally present number of semiconductor chips on the source substrate, preferably a third or a sixth of the semiconductor chips is transferred to a target substrate in step C). This means that the corresponding source substrate can serve as a source substrate for a plurality of different target substrates. For example, from a source substrate a third of the originally present semiconductor chips is transferred row-by-row to three different target substrates. The same applies to another portion of the semiconductor chips transferred in step C).

According to at least one embodiment, at least one of the source substrates is a growth substrate for the associated semiconductor chips. Alternatively, it is possible for the source substrate to be a replacement carrier for a growth substrate; this applies in particular to red or infrared-emitting semiconductor chips. The replacement carrier in the form of the source substrate is applied to a side of the corresponding semiconductor layer sequence facing away from the growth substrate, whereupon the growth substrate is removed. During transfer from the growth substrate to the replacement carrier, in particular the corresponding source substrate, positions of the semiconductor chips relative to one another do not change.

According to at least one embodiment, the semiconductor chips are electrically controllable individually and independently of one another. Thus, pixels can be constructed which emit light of different colors as a function of time.

According to at least one embodiment, step C) is followed by a step D). In step D), the target substrate is singulated. Individual pixels can be formed by the singulation. It is likewise possible that as a result of the singulation and by an optional cutting, one or a plurality of display devices having a plurality of pixels are formed.

Embodiments of the invention further relates to an optoelectronic semiconductor component. The semiconductor component is preferably produced using a method as described in connection with one or more of the above-mentioned embodiments. Features of the method are therefore also disclosed for the optoelectronic semiconductor component and vice versa.

In at least one embodiment, the optoelectronic semiconductor component is a display device or a pixel for a display device. The semiconductor component comprises a target substrate having a mounting plane and at least two types of radiation-emitting semiconductor chips on the target substrate. Furthermore, at least two casting layers are present so that each of the casting layers is assigned to exactly one type of semiconductor chips and the casting layer and the associated type of semiconductor chips lie in a common plane. Each type of semiconductor chips has a different height above the mounting plane.

According to at least one embodiment, the semiconductor component is a pixel. Such a pixel can also be referred to as an image point or color triple unit. In particular, the pixel is an RGB unit having exactly three different types of semiconductor chips and/or having exactly three or exactly four semiconductor chips.

According to at least one embodiment, the target substrate is a permanent carrier. The target substrate is, for example, a metallic carrier, a ceramic carrier, a glass carrier or a semiconductor carrier. The target substrate is preferably free of plastics and/or organic materials.

According to at least one embodiment, the semiconductor component is a display device for displaying colored films and/or images. The display device preferably comprises at least $10^4$ or $10^5$ or $10^6$ and/or at most $10^8$ or $10^7$ or $10^6$ of the semiconductor chips.

According to at least one embodiment, a positioning tolerance across all semiconductor chips of one type and across the target substrate is at most 10 µm or 5 µm or 1 µm. The positioning tolerance substantially corresponds to a tolerance for a phototechnique when producing the semiconductor chips on a growth substrate. This comparatively low positioning tolerance can be achieved because of the wafer-to-wafer process during the transfer of the semiconductor chips from the source substrate, which is in particular a growth substrate, onto the target substrate. An average diameter of a region over which the semiconductor chips are distributed and over which said positioning tolerance is maintained, is preferably at least 2 cm or 5 cm or 10 cm and/or at most 30 cm or 15 cm or 5 cm.

BRIEF DESCRIPTION OF THE DRAWINGS

A method described here and an optoelectronic semiconductor component described here are explained in more detail below with reference to the drawing on the basis of exemplary embodiments. Identical reference signs indicate the same elements in the individual figures. However, no relationships to scale are illustrated; rather, individual elements can be represented with an exaggerated size in order to afford a better understanding.

In the figures.

DETAILED DESCRIPTION OF ILLUSTRATIVE EMBODIMENTS

FIG. 1 shows an exemplary embodiment of a method for producing optoelectronic semiconductor components 1, 11. According to FIG. 1A, a target substrate 3 having a mounting plane 30 is provided. The target substrate 3 is, for example, a ceramic substrate or a semiconductor substrate such as a silicon substrate, which can contain electrical structures for driving and/or conductor tracks. First electrical contact areas 91 are located on the mounting plane 30. The first contact areas 91 are formed, for example, by one or more metallizations and are preferably configured for soldering or electrically conductive adhesive bonding.

Figure 1A:
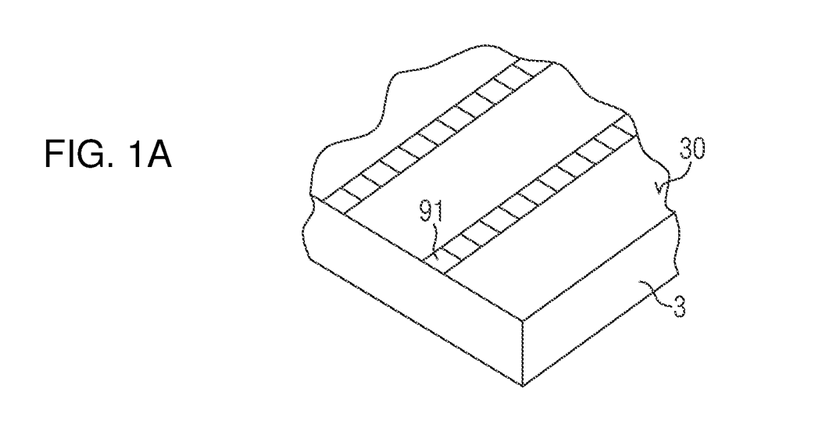
FIGS. 1A-1I show schematic perspective representations of method steps of an exemplary embodiment of a method described here for producing optoelectronic semiconductor components described here.
Figure 1B:
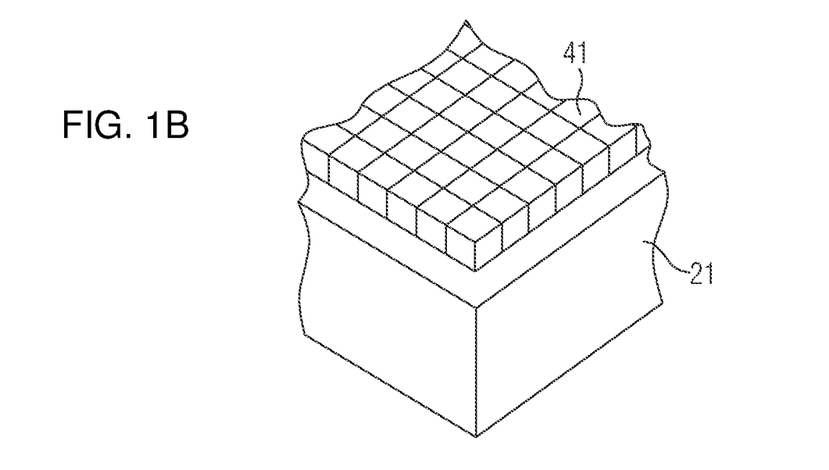

In the method step of FIG. 1B, a first source substrate 21 is provided. The first source substrate 21 has first semiconductor chips 41, which are densely packed or approximately densely packed on a main side. The first semiconductor chips 41 are, for example, light-emitting diode chips for generating blue light. The first semiconductor chips 41 have in particular a semiconductor layer sequence which is based on the material system AlInGaN. The first source substrate 21 is preferably a growth substrate for the first semiconductor chips 41. For example, the first source substrate 21 is a sapphire substrate.

Figure 1C:
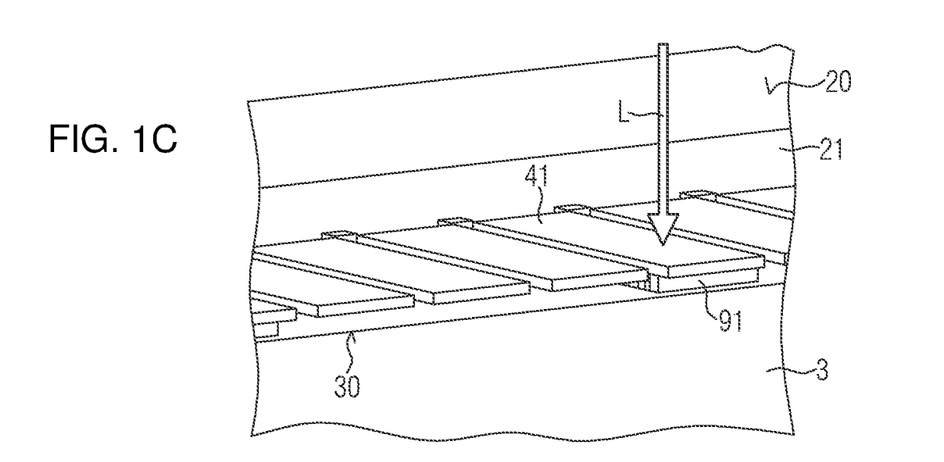

FIG. 1C shows how the first semiconductor chips 41 are applied to the first contact areas 91. For this purpose, the first source substrate 21 and the target substrate 3 are brought together so that the first semiconductor chips 41 face the mounting plane 30. A certain portion of the first semiconductor chips 41 is arranged above the associated first contact areas 91. Said first semiconductor chips 41 are electrically and mechanically fixedly connected to the first contact areas 91 by soldering or electrically conductive adhesive bonding.

Subsequently, said first semiconductor chips 41 are detached from the first source substrate 21. This detachment is, for example, a laser lift-off method with a laser radiation L through the first source substrate 21.

Figure 1D:
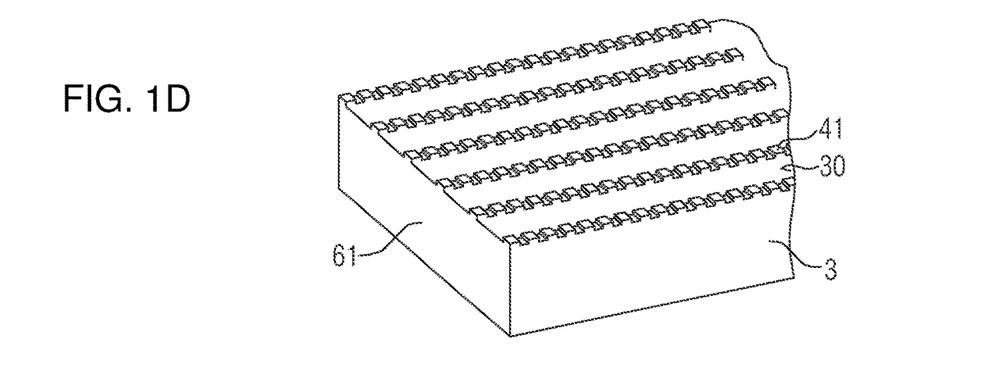

Thus, see FIG. 1D, rows 61 with the first semiconductor chips 41 remain on the mounting plane 30. The first source substrate 21 with the remaining, non-transferred first semiconductor chips 41 is then removed.

In this way, a row of the first semiconductor chips 41 is absent at the first source substrate 21 after this method step, and the remaining first semiconductor chips 41 can be transferred in a subsequent method step, which corresponds to the step of FIG. 1C, for example, row-by-row onto a further target substrate (not shown).

Figure 1E:
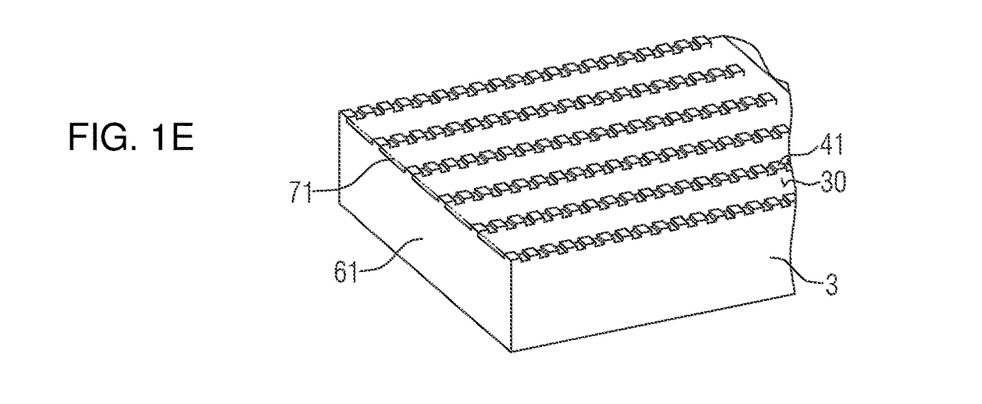

Thereafter, see FIG. 1E, a first casting layer 71 is produced. A planarization of the first semiconductor chips 41 is achieved with the first casting layer 71. That is to say that the first casting layer 71 is of the same thickness as the first semiconductor chips 41. The mounting plane 30 can be completely covered by the first semiconductor chips 41 together with the first casting layer 71. A material of the first casting layer 71 can be located between adjacent first semiconductor chips 41 along the rows 61 with the first semiconductor chips 41.

The first casting layer 71 can be light-transmissive or reflective. The first casting layer 71 is, likewise, of a silicone, an acrylate, an epoxide, a polymer, for example, based on benzocyclobutene, BCB for short, or alternatively of an oxide or a glass such as spin-on oxide. In the case of a reflective first casting layer 71, the latter can have reflecting particles, for instance made of titanium dioxide.

Figure 1F:
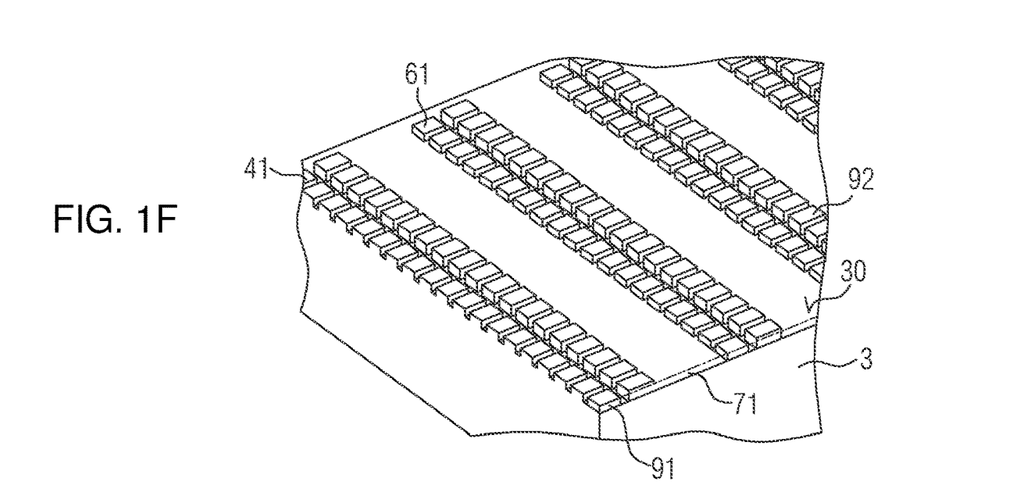

In the step of FIG. 1F, a plurality of second electrical contact areas 92 is produced on the first casting layer 71. The second contact areas 92 are located row-by-row directly at the rows 61 with the first semiconductor chips 41. For example, the second contact areas 92 are produced by means of vapor deposition or galvanically.

Figure 1G:
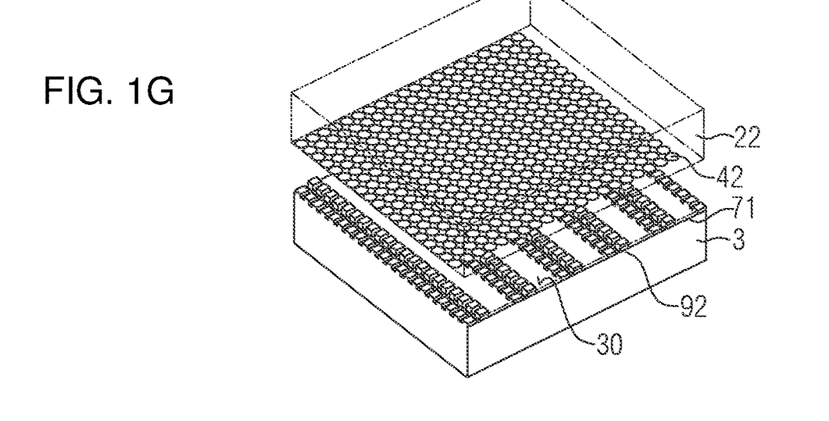

According to FIG. 1G, a second source substrate 22 having second semiconductor chips 42 is provided. The second semiconductor chips 42 are, for example, red-emitting light-emitting diode chips. The second source substrate 22 is in particular a replacement carrier for a growth substrate of the second semiconductor chips 42.

The second semiconductor chips 42 are, for example, soldered or electrically conductively adhesively bonded to the second contact areas 92, analogously to FIG. 1C. Once again analogously to FIG. 1C, these second semiconductor chips 42 are detached from the second source substrate 22, for instance by means of laser radiation.

Subsequently, the correspondingly transferred second semiconductor chips 42 remain on the second contact areas 92, see FIG. 1H. Thus, two rows 61, 62 of semiconductor chips 41, 42 emitting different colors are located on the target substrate 3 after this second transfer step.

Figure 1H:
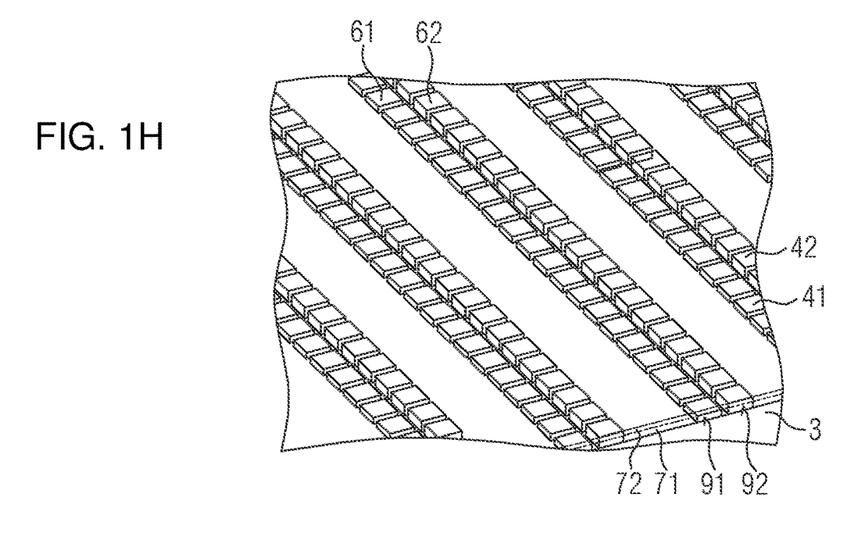

Thereupon, see also FIG. 1H, a second casting layer 72 is applied, which planarizes the second semiconductor chips 42. The second casting layer 72 is light-transmissive so that the light generated in the first semiconductor chips 41 can be radiated through the second casting layer 72. The first casting layer 71 and the first semiconductor chips 41 can be completely covered by the second casting layer 72 together with the second semiconductor chips 42.

Figure 1I:
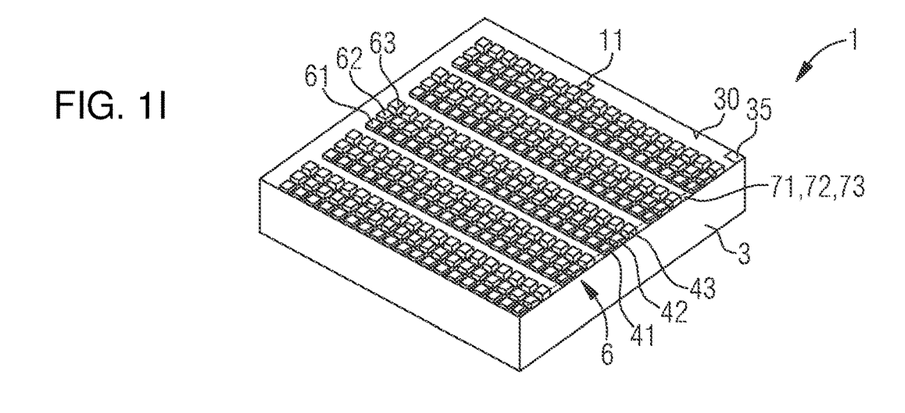

Analogously, third semiconductor chips 43 are applied and a third casting layer 73 is formed, which planarizes the third semiconductor chips 43. This results in an arrangement of three rows 61, 62, 63 of first semiconductor chips 41, second semiconductor chips 42 and third semiconductor chips 43 above the mounting plane 30, as illustrated in FIG. 1I.

The last transferred third semiconductor chips 43 are, for example, green-emitting thin-film light-emitting diode chips, which are transferred in particular directly from a growth substrate to the target substrate 3. The semiconductor chips 41, 42, 43 are electrically preferably combined into groups of three, so that individual pixels 11 result.

As in all other exemplary embodiments, it is also possible for the target substrate 3, in particular on the mounting plane 30, to comprise one or more positioning marks 35. By means of such positioning marks 35, the target substrate 3 and the source substrates 21, 22 can be positioned exactly one above the other.

A thickness of the semiconductor chips 41, 42, 43 is, as in all other exemplary embodiments, preferably at least 2 μm or 3 μm and/or at most 8 μm or 6 μm. The different types of semiconductor chips 41, 42, 43 can have different thicknesses. A height of steps of a staircase 6 formed by the rows is, for example, at least 1 μm or 4 μm and/or at most 20 μm or 10 μm.

In the method shown in FIG. 1, the pixels 11 each have exactly one semiconductor chip 41, 42, 43 per emission color. In the same way, a plurality of semiconductor chips 41, 42, 43 present per emission color can be, for example, two green-emitting third semiconductor chips 43 for RGGB pixels. It is then possible for the two third semiconductor chips 43 per pixel 11 to lie on differently high casting layers and that the transfer step of FIGS. 1C and 1G is repeated accordingly so that a staircase 6 with then four rows or more results (not shown). In the case of such or similar pixels 11, which exceed an RGB arrangement having three semiconductor chips 41, 42, 43, different heights can be present within one type of semiconductor chips 41, 42, 43, wherein precisely one height and/or row and/or step is formed per transfer step, so that the semiconductor chips 41, 42, 43 of different types are in any case located at different heights. Thus, as is preferred also in all other exemplary embodiments, a number of different heights is equal to the number of semiconductor chips 41, 42, 43 per finished pixel 11.

A basic idea of the production process is thus a thin film bonding process with a subsequent laser lift-off method for detaching the chip carrier substrate. The latter can subsequently be reused. Chips emitting red are preferably transferred to a transparent substrate in order to enable the laser lift-off method, since the respective growth substrate is normally not transparent in this case.

This method can be used for each transfer and is not limited to RGB pixels. For example, IR emitters or also detector elements could be combined with other components, too. For example, silicon is transparent for near-infrared radiation. Thus, an IR emitter can be mounted underneath an Si detector. In this way, an optocoupler can be realized. For this purpose, the IR emitter and the IR detector could have different electrical connections in order to separate the associated circuits from one another in a potential-free manner. Components having an IR emitter and/or an IR detector can be used, for example, for sensor applications, such as, for example, biomonitoring. It is also possible to combine segmented IR emitters and/or segmented IR detectors which do not use Si as the sensitive material.

A method similar to that of FIG. 1 is illustrated in FIG. 2. According to FIG. 2A, analogously to FIG. 1D the first contact areas 91, on which the first semiconductor chips 41 are applied, were produced on the target substrate 3. Electrical connection surfaces 88 for electrically contacting the first semiconductor chips 41 are located on a side of the first semiconductor chips 41 facing away from the mounting plane 30.

Figure 2A:
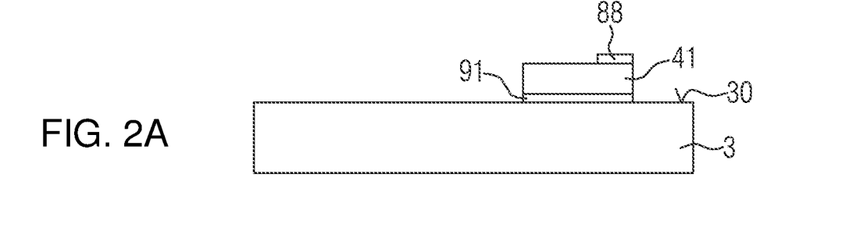
FIGS. 2A-2H and FIGS. 3A-3D show schematic sectional representations of method steps of exemplary embodiments of methods described here for producing optoelectronic semiconductor components described here.
Figure 2B:
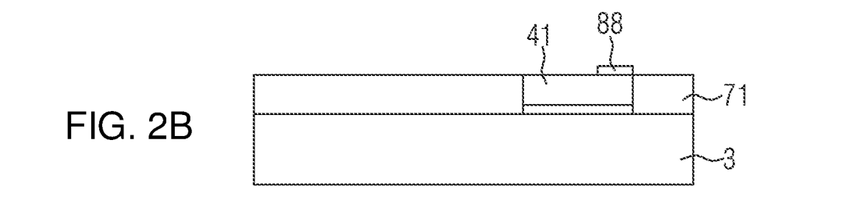

FIG. 2B shows that the first casting layer 71 is applied. The first casting layer 71 terminates flush with a side of the first semiconductor chips 41 which faces away from the mounting plane 30. In this case, the connection surfaces 88 protrude out of the first casting layer 71.

Figure 2C:
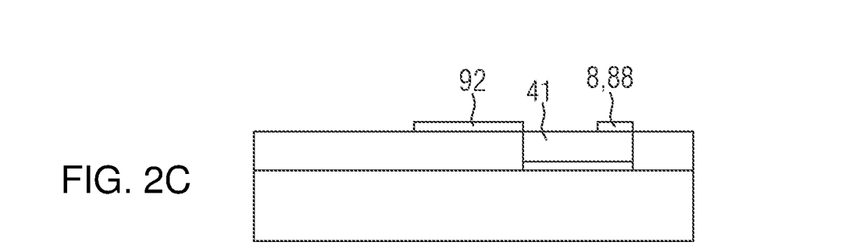

The second contact areas 92 are then produced, see FIG. 2C. At the same time, electrical lines 8 for connecting the first and/or the second semiconductor chips 41, 42 can be produced.

Figure 2D:
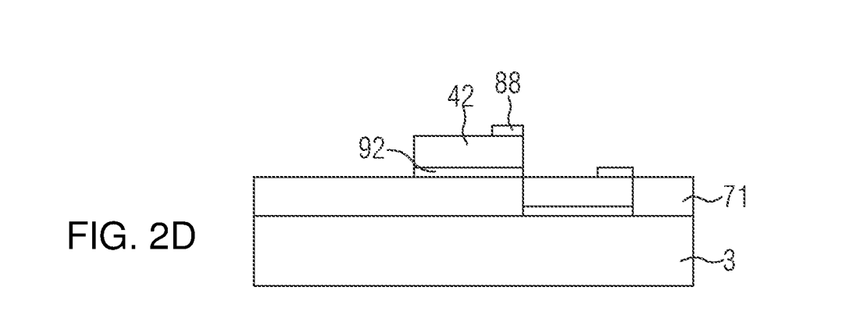
Figure 2E:
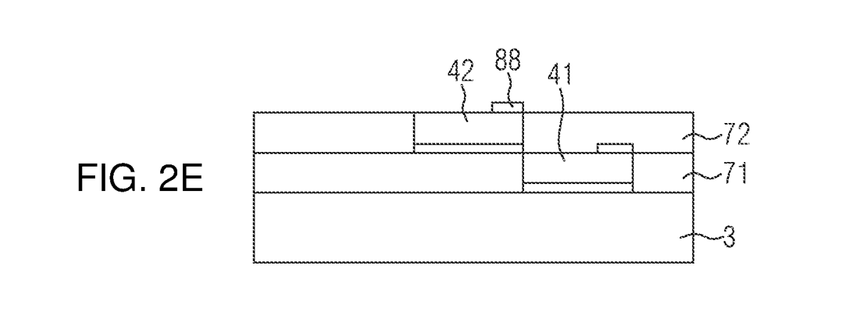

Subsequently, the second semiconductor chips 42 are applied, see FIG. 2D, and the second casting layer 72 is produced, see FIG. 2E. The steps of FIGS. 2D and 2E are carried out analogously to FIGS. 2A and 2B.

Figure 2F:
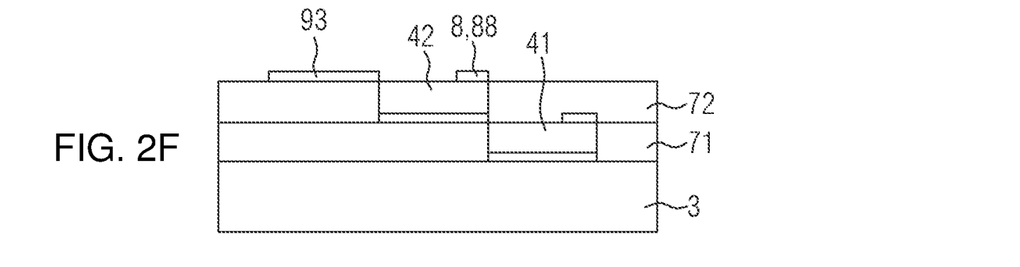
Figure 2G:
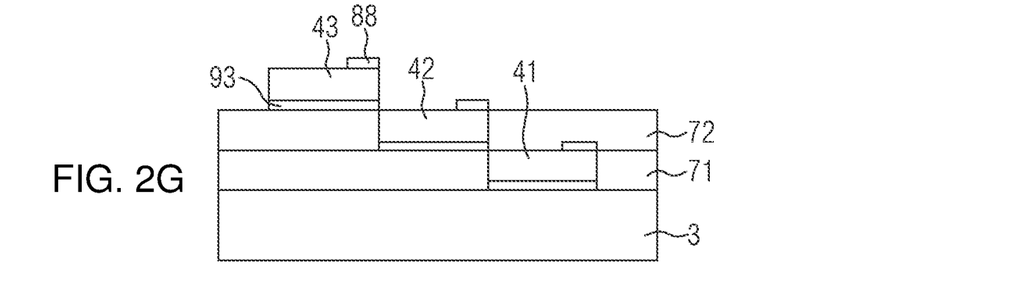

Finally, third contact areas 93 are formed for the third semiconductor chips 43, as illustrated in FIG. 2F. The third semiconductor chips 43 are subsequently mounted, see FIG. 2G.

Figure 2H:
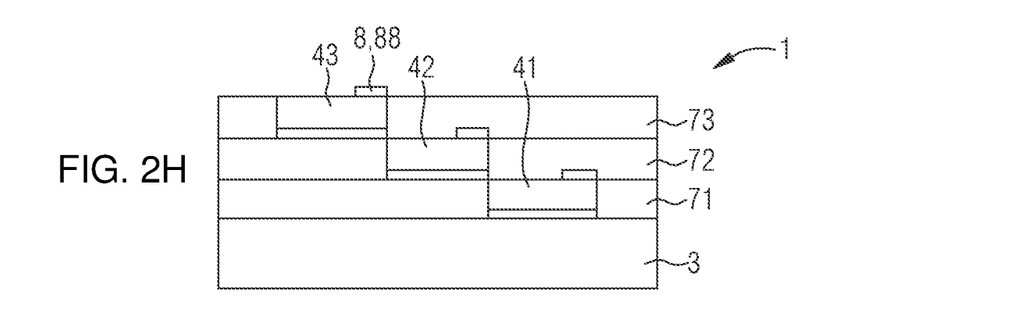

The finished display device 1 is shown in FIG. 2H. The third semiconductor chips 43 are planarized by means of the third casting layer 73. In the direction parallel to the mounting plane 30, the respective casting layers 71, 72, 73 thus lie in the same plane as the respectively associated semiconductor chips 41, 42, 43. The semiconductor chips 41, 42, 43 can abut one another in the direction parallel to the mounting plane 30, seen in a plan view.

This means that in the method of FIG. 2, after each transfer step of the semiconductor chips 41, 42, 43, the resulting level difference is compensated by one of the casting layers 71, 72, 73. The following contact areas 92, 93 and semiconductor chips 41, 42, 43 are then formed on the resulting planarized level. The component is thus constructed sequentially in terms of height.

In the case of this geometry, when a 6 inch wafer is used, in one transfer step, for example, 150 chips×10 rows are transferred, that is to say approximately 1500 semiconductor chips. At approximately 500 rows, the transfer rate per step is approximately $10^6$ semiconductor chips.

In the method of FIG. 3, the semiconductor chips 41, 42, 43 are not arranged next to one another in a lateral direction, but stacked one above the other. For this purpose, see FIG. 3A, the first semiconductor chips 41 are mounted on the first contact areas 91 on the mounting plane 30. The first semiconductor chips 41 serve, for example, to generate red light.

Figure 3A:
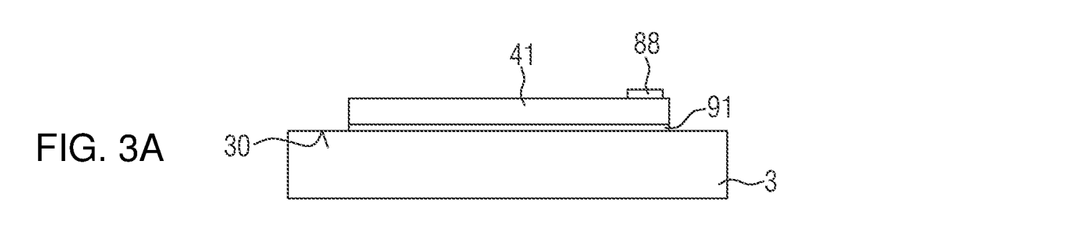
Figure 3B:
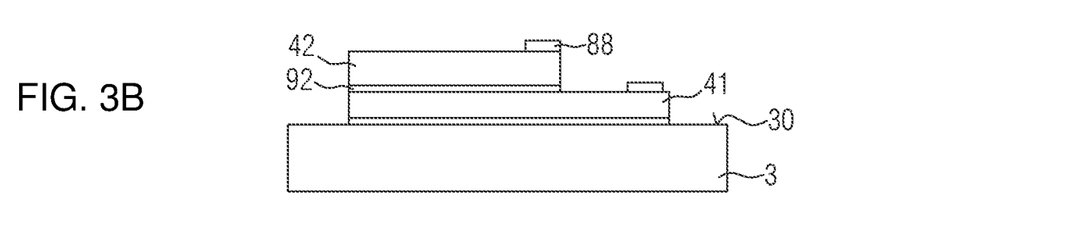

According to FIG. 3B, the second semiconductor chips 42 are applied to the first semiconductor chips 41. In this case, the first semiconductor chips 41 are provided with the second contact areas 92. On one side, parallel to the mounting plane 30, the second semiconductor chips 42 terminate flush with the first semiconductor chips 41. For example, green light is generated in the second semiconductor chips 42.

Figure 3C:
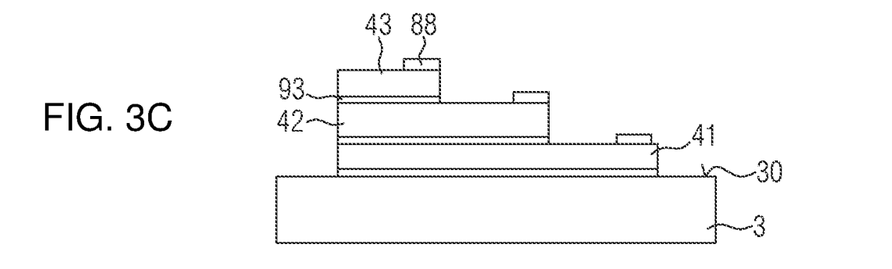

Finally, see FIG. 3C, the third semiconductor chips 43 are mounted on the third contact areas 93 above the second semiconductor chips 42. In turn, in the direction parallel to the mounting plane 30, the third semiconductor chips 43 terminate flush with the first and second semiconductor chips 41, 42. The third semiconductor chips 43 preferably serve to generate blue light.

Figure 3D:
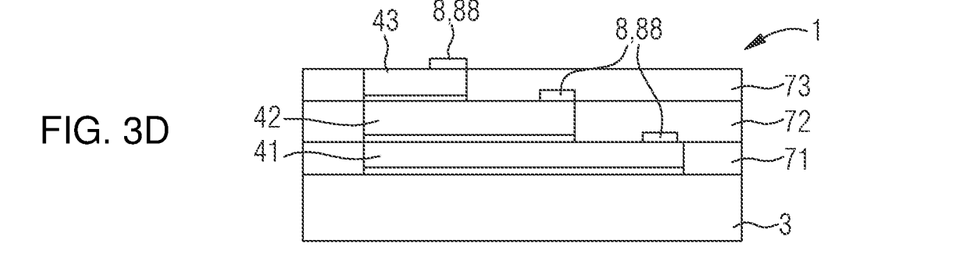

The casting layers 71, 72, 73 are then produced, see FIG. 3D. Deviating from the representation of FIG. 3D, only one single casting layer can also be present.

Figure 4A:
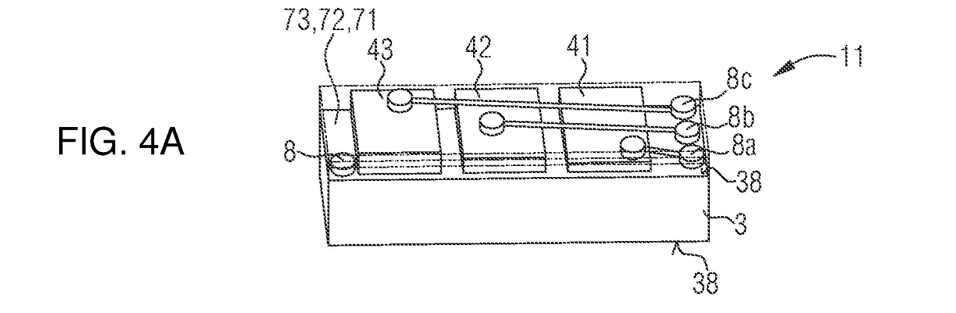
FIGS. 4A-4D, FIGS. 5A-5C, FIG. 6, FIG. 7, FIG. 8, FIG. 9 and FIG. 10 show schematic illustrations of exemplary embodiments of optoelectronic semiconductor components described here.

In addition to the methods illustrated in FIGS. 1 to 3, a non-shown separation step can take place in each case. The target substrate is then subdivided as desired by means of the singulation, so that, for example, a plurality of display devices 1 having a plurality of pixels 11 result. Likewise, out of the target substrate 3, many individual color triple units can be generated for exactly one pixel 11 in each case, see the perspective representation in FIG. 4A.

Figure 4B:
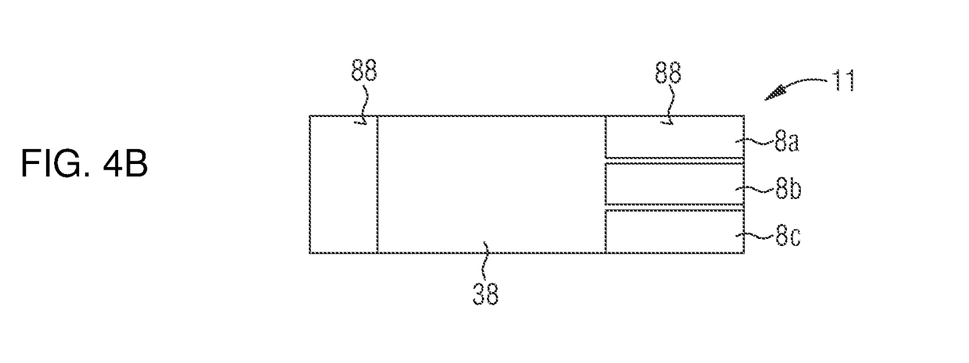

FIG. 4B illustrates a rear side 38 of the pixel 11. For example, a connection surface 88 for a common conductor track is present and also in each case an additional connection surface 88 for the electrical lines 8a, 8b, 8c. In contrast to the illustration of FIG. 4B, other configurations of electrical connection surfaces 88 can also be present on the rear side 38 or on the mounting plane 30. Furthermore, it is possible, as in all other exemplary embodiments, instead of at least some or all of the electrical lines 8a, 8b, 8c to use bonding wires for electrical interconnection.

Figure 4C:
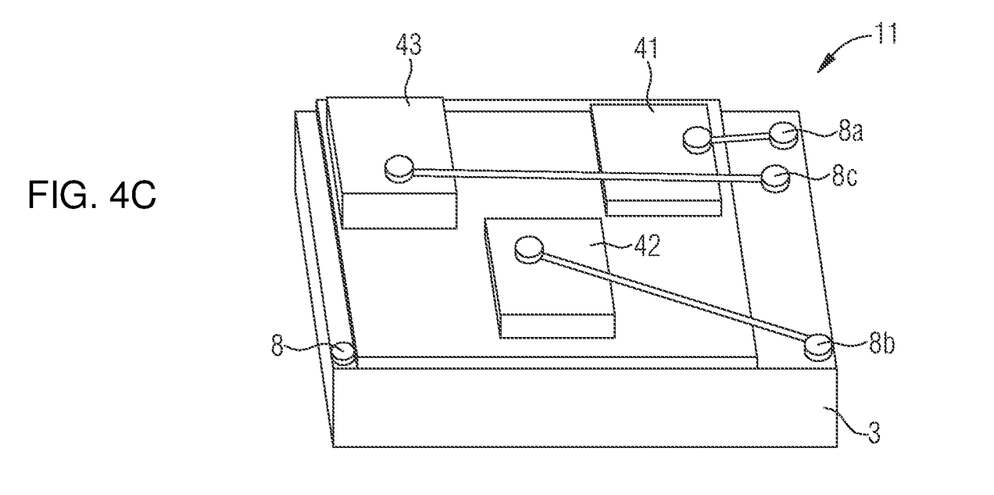

A further exemplary embodiment of a pixel 11 is illustrated in the perspective representation of FIG. 4C, wherein the casting layers are not shown in order to simplify the representation. In this case, the semiconductor chips 41, 42, 43 do not lie in a straight line perpendicular to the rows 61, 62, 63, for example, from FIG. 1I, but the semiconductor chips 41, 42, 43 are arranged offset with respect to one another. This is achieved, for example, in that only every second semiconductor chip 41, 42, 43 is transferred from the source substrates 21, 22 differently than shown in connection with FIG. 1C or 1G.

Figure 4D:
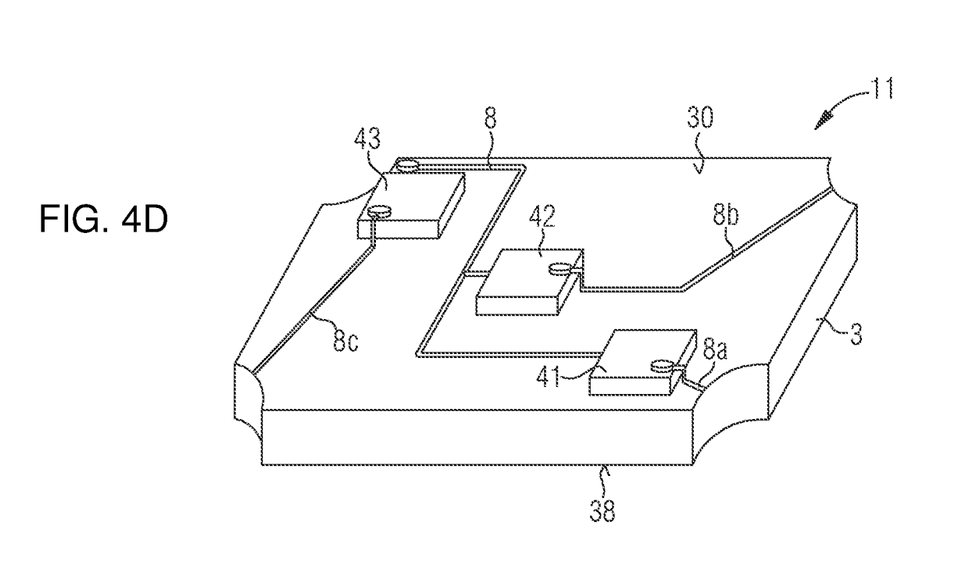

A further arrangement example is shown in a perspective view in FIG. 4D; again, the casting layers are not shown in order to simplify the illustration. It is possible, as in all other exemplary embodiments, for the electrical lines 8a, 8b, 8c to be guided along side faces of the semiconductor chips 41, 42, 43 onto the mounting plane 30. Connection areas of the pixel 11 can be located on the mounting plane 30 or, preferably, on the rear side 38.

In order to guide the lines 8, 8a, 8b, 8c from the mounting plane 30 to the rear side 38, there are, for example, quarter-circular recesses at the corners or semicircular recesses on the side faces, which can be metallized and lead to the rear side 38. The same is also possible in all other exemplary embodiments.

Thus, along the rows 61, 62, 63, distances to each other between the semiconductor chips 41, 42, 43 correspond in each case to a multiple of the distances of the semiconductor chips 41, 42, 43 on the source substrates 21, 22, see, e.g., FIG. 1I; the distances between the rows 61, 62, 63, however, and thus between the colors, can be freely set. As shown in connection with FIGS. 3A to 3D, an arrangement geometry of the semiconductor chips 41, 42, 43 can be modified. Thus, for example, from each row of semiconductor chips 41, 42, 43 on the source substrates 21, 22, only every second or every third semiconductor chip 41, 42, 43 is transferred. As a result, the display device 1 and also the pixels 11 can be scaled.

As in all other exemplary embodiments, the target substrate 3 is, for example, a glass carrier, a ceramic carrier, for instance made of aluminum oxide or aluminum nitride, a silicon carrier, for example, with electrical plated-through holes or with integrated electrical circuits, a plastic carrier or a substrate produced by a molding technique. It is also possible to use a composite substrate made of a plurality of different materials.

The geometry of the arrangement of the semiconductor chips 41, 42, 43 can thus be modified according to the number of selected semiconductor chips on the corresponding source substrate 21, 22.

Figure 5A:
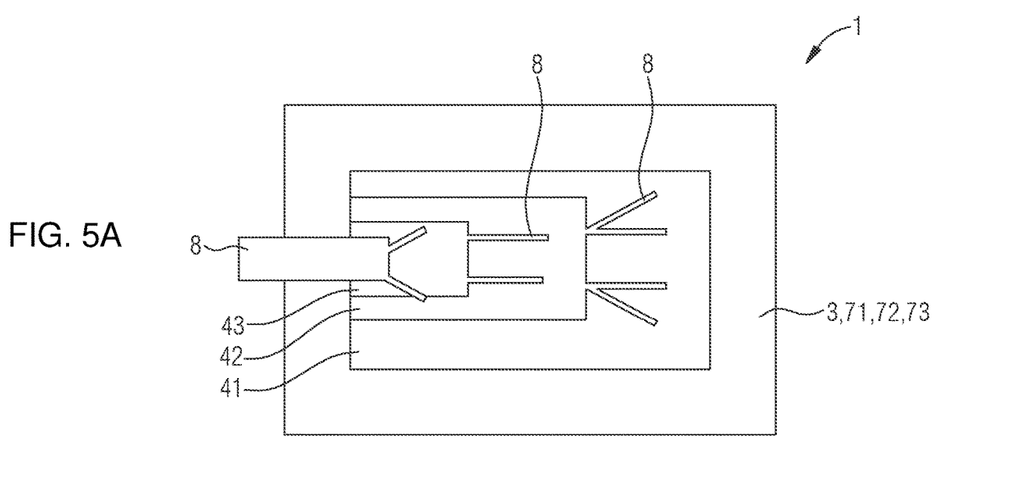
Figure 5B:
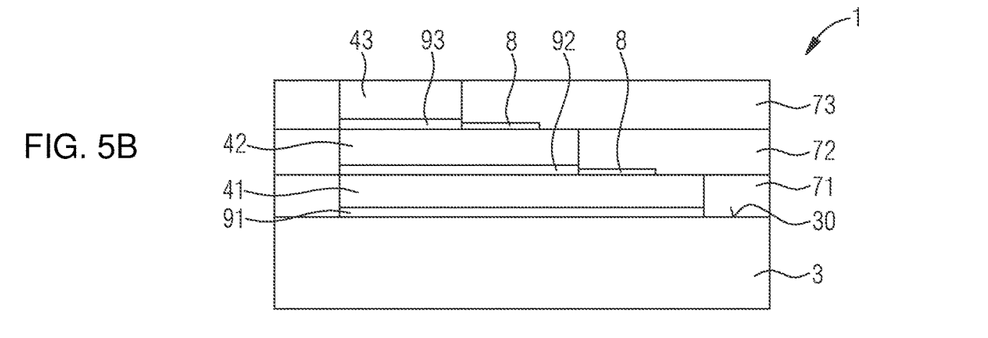
Figure 5C:
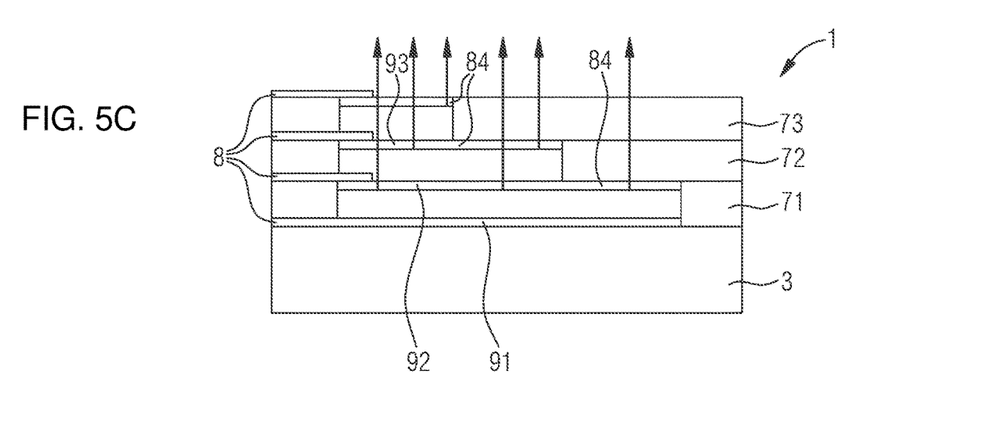

FIG. 5A shows a top view and FIGS. 5B and 5C show sectional representations of further exemplary embodiments of display devices 1. In this case, light-impermeable, metallic lines 8 are present, via which the semiconductor chips 41, 42, 43 are electrically connected. Viewed in a plan view, the lines 8 cover a small part of the semiconductor chips 41, 42, 43. The lines 8 have branched, narrow extensions, which serve for a two-dimensional current spreading across the semiconductor chips 41, 42, 43. Optionally, see FIG. 5C, light-transmissive current spreading layers 84 are present, which are composed, for example, of a transparent conductive oxide such as ITO. Such current spreading layers 84 can also be present in all other exemplary embodiments.

In combination with the current spreading layers 84 or even without such current spreading layers, reflective layers can be formed between the stacked semiconductor chips 41, 42, 43. By means of reflecting layers (not shown), it can be achieved that radiation generated in the semiconductor chips 41, 42, 43 more distant from the target substrate 3 does not pass into the semiconductor chips 41, 42, 43 located closer to the target substrate 3. Increased efficiency can thereby be achieved. Such reflecting layers can also be present in all other exemplary embodiments.

In FIG. 5C, it is also shown that the lines 8 are guided laterally out of the display device 1. Thus, the lines 8 run on the respective semiconductor chips 41, 42, 43. Such an arrangement is also possible in all other exemplary embodiments. The light emission is symbolized by arrows.

In order to electrically and mechanically connect the semiconductor chips 41, 42, 43 to one another, an oxidic bonding process or the use of a polymer with conductive particles, for example, of Ag or ITO, can be applied. The longer-wave emitting semiconductor chips 41, 42, 43 are preferably mounted below the short-wave emitting semiconductor chips 41, 42, 43, in order to avoid absorption in the overlying semiconductor chips 41, 42, 43. However, other arrangements of the semiconductor chips 41, 42, 43 are also possible, for example, depending on the size, efficiency or required brightness of the respective semiconductor chips 41, 42, 43.

Figure 6:
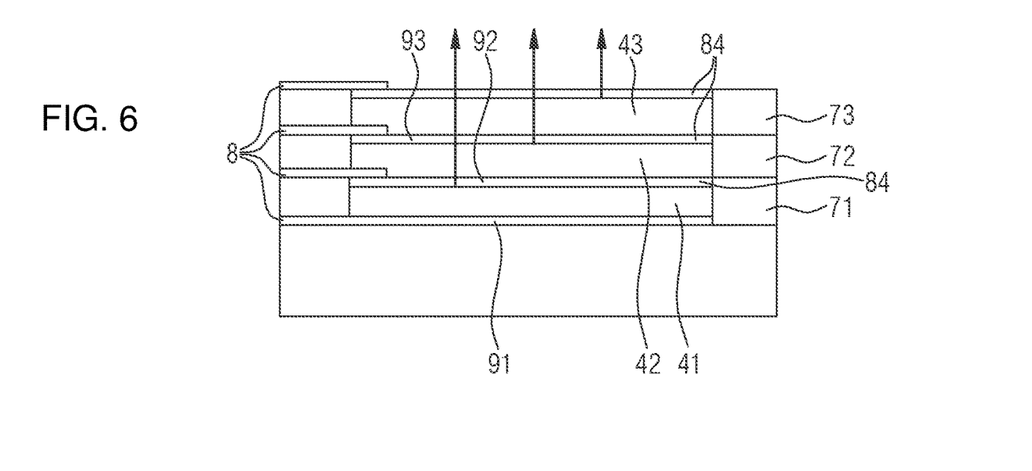

According to FIG. 6, the semiconductor chips 41, 42, 43 are arranged stacked congruently one above the other.

Figure 7:
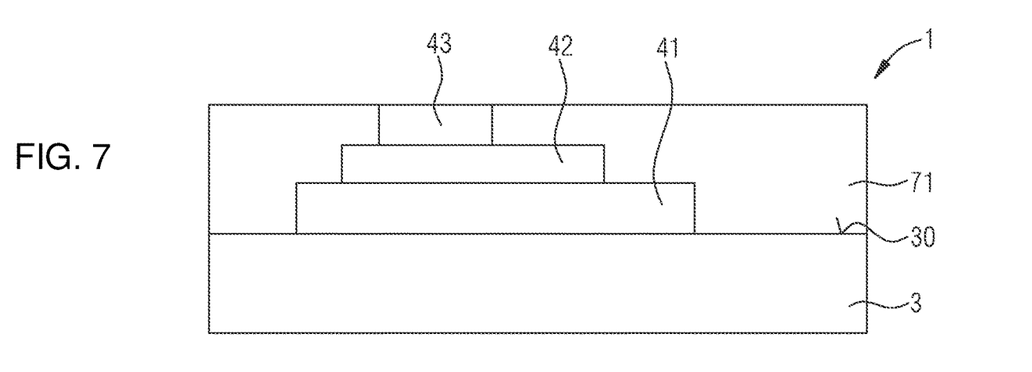

In the exemplary embodiment of FIG. 7, the semiconductor chips 41, 42, 43 are stacked asymmetrically on top of one another so that the semiconductor chips 41, 42, 43 do not terminate flush with one another at side edges. Furthermore, only one casting layer 71 is present. The casting layer 71 can also be omitted, as is also possible in the other exemplary embodiments with the semiconductor chips 41, 42, 43 stacked one above the other.

Figure 8:
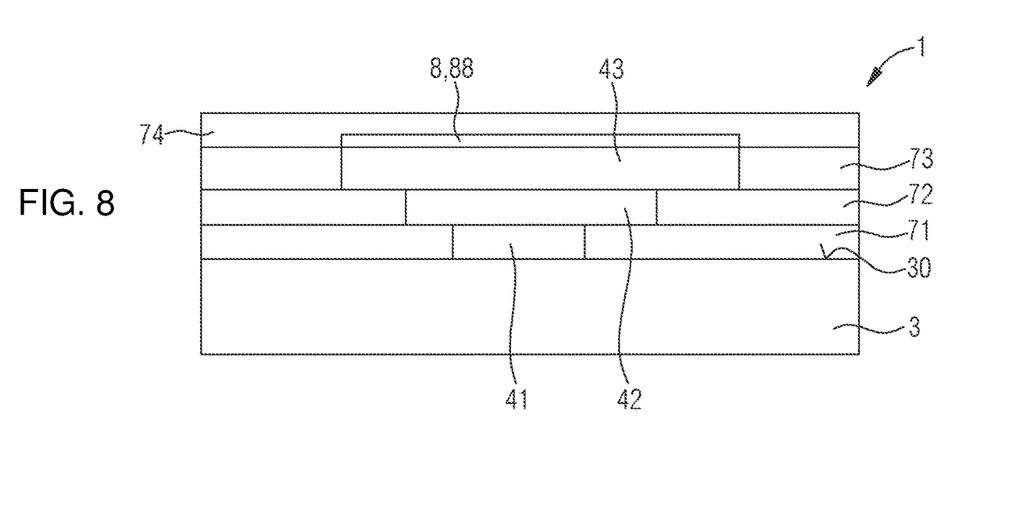

FIG. 8 shows that the semiconductor chips 41, 42, 43 increase in size in the direction away from the target substrate 3 so that semiconductor chips 42, 43 which are applied later completely cover the previously mounted semiconductor chips 41, 42. In this case, the target substrate 3 can be light-transmissive so that the intended emission of light takes place through the target substrate 3, in contrast to the previous embodiments.

Optionally, as is possible in all other exemplary embodiments, a cover layer 74 is present. The cover layer 74 can serve as a protective layer. Furthermore, a final planarization can be achieved by means of the cover layer 74.

Figure 9:
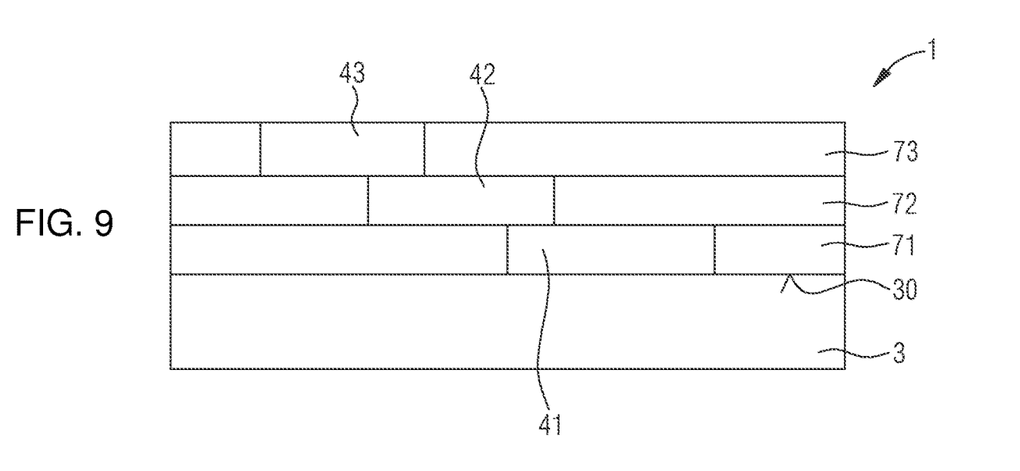

In the exemplary embodiment of FIG. 9, a mixed form of the previous exemplary embodiments is present. This means that the semiconductor chips 41, 42, 43 overlap only partly. The semiconductor chips 42, 43 located further away from the target substrate 3 are located only in part on the previously applied semiconductor chips 41, 42 and in part on the previously produced casting layers 71, 72.

Figure 10:
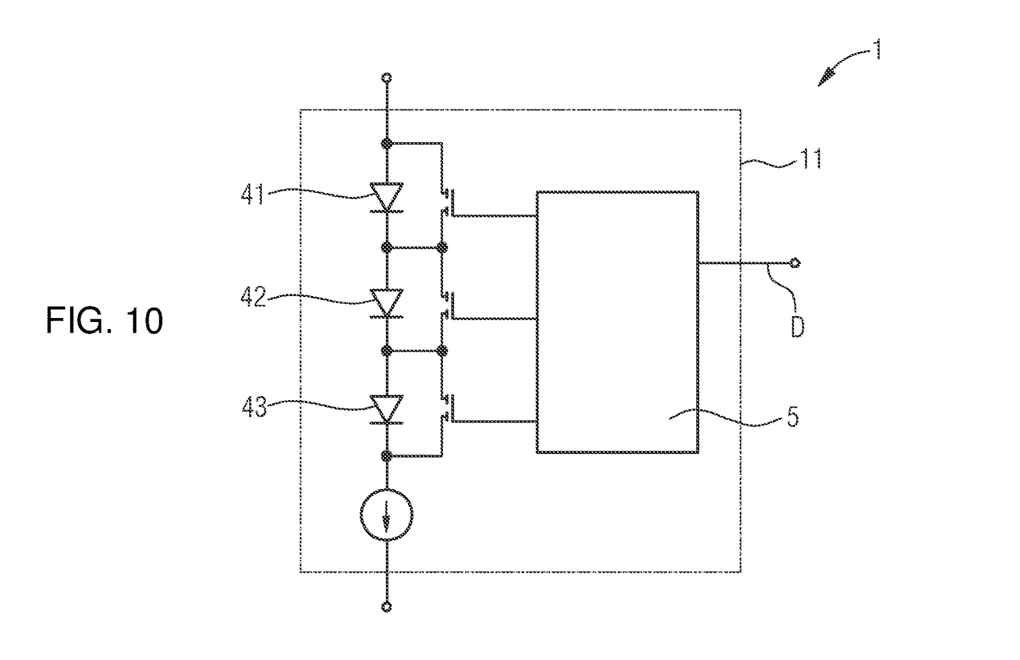

An electrical interconnection of the individual pixels 11 is illustrated in FIG. 10. The semiconductor chips 41, 42, 43 are controlled by means of switching elements such as transistors, which are connected to a control unit 5. One control unit 5, which is connected to a data line D, can be provided for each pixel 11. The semiconductor chips 41, 42, 43 are supplied with power via a supply line V.

This results in a short circuit between the cathode and the anode of semiconductor chips 41, 42, 43 lying one above the other. In this way, a series connection of the semiconductor chips 41, 42, 43 is provided. Since each semiconductor chip has to be individually energized, in order to achieve all points in the color triangle in the CIE standard chromaticity diagram, control is achieved, for example, by field effect transistors connected in parallel with the semiconductor chips 41, 42, 43. If the transistors are closed, no current flows through the associated semiconductor chip 41, 42, 43. If the respective transistor is opened, the associated semiconductor chip 41, 42, 43 produces light.

Since transistors are necessary in the vicinity of the semiconductor chips 41, 42, 43, an active matrix operation is appropriate. Further transistors for pulse width modulation or pulse length modulation and/or for a memory can be realized with low additional effort. The same applies to a constant current source for the individual pixels. The pixels are supplied with brightness information via one or more data lines D.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

What is claimed is:

1. A method for producing an optoelectronic semiconductor component, the method comprising:
   providing at least two source substrates, wherein each of the source substrates is equipped with a specific type of radiation-emitting semiconductor chips;
   providing a target substrate having a mounting plane for mounting the types of semiconductor chips;
   transferring at least part of the types of semiconductor chips with a wafer-to-wafer process from the source substrates onto the target substrate so that the types of semiconductor chips maintain their relative position with respect to one another, so that each type of semiconductor chips arranged on the target substrate has a different height above the mounting plane; and
   providing at least two casting layers,
   wherein the semiconductor chips of at least one type are applied to at least one of the casting layers,
   wherein each transfer of one specific type of semiconductor chips is followed by forming of one of the casting layers,
   wherein the casting layer associated with one type of the semiconductor chips is located in the same plane with the respective type of semiconductor chips,
   wherein the casting layers each substantially terminate flush with the associated type of semiconductor chips on a side of the associated chips facing away from the mounting plane, and
   wherein the casting layers have the same thicknesses as the associated type of semiconductor chips, with a tolerance of at most 5 µm and of at most 25% of a mean height of the associated type of semiconductor chips.

2. The method according to claim 1, wherein electrical lines for connecting the specific type of semiconductor chips are arranged on both main sides of the respective casting layer associated with this specific type of semiconductor chips.

3. The method according to claim 1, wherein all casting layers are light-transmissive.

4. The method according to claim 1, wherein the semiconductor chips do not overlap with one another as seen in plan view.

5. The method according to claim 1, wherein at least one type of semiconductor chips is applied completely or partially to the casting layer which is uniquely assigned to the previously applied type of semiconductor chips.

6. The method according to claim 1,
   wherein the semiconductor chips partially or completely overlap one another when viewed in a plan view, and
   wherein light, which is generated in semiconductor chips lying closer to the mounting plane, in a finished display device is designed to be emitted at least partially through the semiconductor chips which are further away from the mounting plane.

7. The method according to claim 1,
   wherein transferring the at least part of the types of semiconductor chips comprises transferring
   at least $10^4$ of the semiconductor chips are transferred per type, and
   wherein precisely three types of semiconductor chips are transferred and one type of semiconductor chips is configured for emitting green light, one type is configured for emitting red light and one type is configured for emitting blue light, so that RGB pixels are formed.

8. The method according to claim 7, wherein the semiconductor chips are arranged in the RGB pixels, when viewed in plan view, to terminate flush with one another at exactly one side edge, with a tolerance of at most 5 µm.

9. The method according to claim 1,
wherein the semiconductor chips are arranged in rows and within a specific row only semiconductor chips of the same type are arranged, and the rows follow one another with a periodicity of n,
wherein, viewed in cross-section, a staircase with n−1 steps is formed in each case by n consecutive rows,
wherein all staircases are identically oriented, and
wherein, viewed in a plan view, a distance between adjacent semiconductor chips within a specific staircase is smaller than a distance between adjacent staircases.

10. The method according to claim 1,
wherein transferring the at least part of the types of semiconductor chips comprises detaching, only a part of the originally present semiconductor chips from the associated source substrate, and
wherein at least one of the source substrates is a growth substrate for the associated semiconductor chips.

11. The method according to claim 1, further comprising, after transferring the at least part of the types of semiconductor chips:
separating the target substrate into individual pixels; and
separating or cutting into at least one display device having a plurality of pixels.

12. The method according to claim 1, wherein all of the casting layers with exception of a casting layer situated closest to the mounting plane are light-transmissive.

13. The method according to claim 1, wherein the casting layer associated with one type of the semiconductor chips directly adjoins the respective type of semiconductor chips, and wherein each casting layer is arranged between adjacent semiconductor chips of the associated type of semiconductor chips.

14. A method for producing an optoelectronic semiconductor component, the method comprising:
providing at least two source substrates, wherein a first source substrate is equipped with a first type of radiation-emitting semiconductor chips and a second source substrate is equipped with a second type of radiation-emitting semiconductor chips;
providing a target substrate having a mounting plane for mounting the first and second types of semiconductor chips;
transferring at least part of the first type of semiconductor chips with a wafer-to-wafer process from the first source substrate onto the target substrate so that the first type of semiconductor chips maintain their relative position with respect to one another;
forming a first casting layer so that the first casting layer is located in the same plane with the first type of semiconductor chips, wherein the first casting layer has the same thicknesses as the first type of semiconductor chips with a tolerance of at most 5 µm and of at most 25% of a mean height of the first type of semiconductor chips;
after forming the first casting layer, transferring at least part of the second type of semiconductor chips with a wafer-to-wafer process from the second source substrate onto the target substrate so that the second type of semiconductor chips maintain their relative position with respect to one another; and
forming a second casting layer so that the second casting layer is located in the same plane with the second type of semiconductor chips, wherein the second casting layer has the same thicknesses as the second type of semiconductor chips with a tolerance of at most 5 µm and of at most 25% of a mean height of the second type of semiconductor chips;
wherein the first casting layer terminates flush with the first type of semiconductor chips on a side of the first type of semiconductor chips facing away from the mounting plane, and wherein the second casting layer terminates flush with the second type of semiconductor chips on a side of the second type of semiconductor chips facing away from the mounting plane.

15. The method according to claim 14, further comprising:
forming first electrical lines for connecting the first type of semiconductor chips on both main sides of the first casting layer; and
forming second electrical lines for connecting the second type of semiconductor chips on both main sides of the second casting layer.

16. The method according to claim 14, wherein the first and second casting layers are light-transmissive.

17. The method according to claim 14, wherein the first and second types of semiconductor chips do not overlap with one another as seen in plan view.

18. The method according to claim 14, wherein the first and second types of semiconductor chips are arranged in rows, and wherein a first row comprises only the first type of semiconductors and a second row comprises only the second type of semiconductor.

* * * * *